United States Patent [19]

Tam

[11] 4,313,266
[45] Feb. 2, 1982

[54] METHOD AND APPARATUS FOR DRYING WAFERS

[75] Inventor: Johann Tam, Santa Clara, Calif.

[73] Assignee: The Silicon Valley Group, Inc., Santa Clara, Calif.

[21] Appl. No.: 145,867

[22] Filed: May 1, 1980

[51] Int. Cl.³ .................................................. F26B 5/08
[52] U.S. Cl. ................................................ 34/8; 34/58; 34/236; 198/344; 269/902; 269/903
[58] Field of Search ............... 198/344, 379, 486, 380; 406/72, 84, 87; 269/902, 903, 287; 34/8, 58, 236

[56] References Cited
U.S. PATENT DOCUMENTS

| | | | |
|---|---|---|---|
| 3,645,581 | 2/1972 | Lasch, Jr. et al. | 198/344 |
| 3,812,947 | 5/1974 | Nygaard | 406/72 |
| 4,236,851 | 12/1980 | Szasz | 406/72 |

FOREIGN PATENT DOCUMENTS 2431507  1/1976  Fed. Rep. of Germany ...... 269/903

Primary Examiner—Larry I. Schwartz
Attorney, Agent, or Firm—Donald C. Feix

[57] ABSTRACT

A method and apparatus for drying a wafer at a drying station includes a wafer holder which grips the wafer on its edge so that there is no contact with a face of the wafer. This eliminates contact areas which could cause stains on the face. A carriage mechanism brings a wet wafer into the drying station at one level and takes the dry wafer out of the drying station at a different level to prevent any contact between the dry wafer and residual moisture at the incoming level.

15 Claims, 24 Drawing Figures

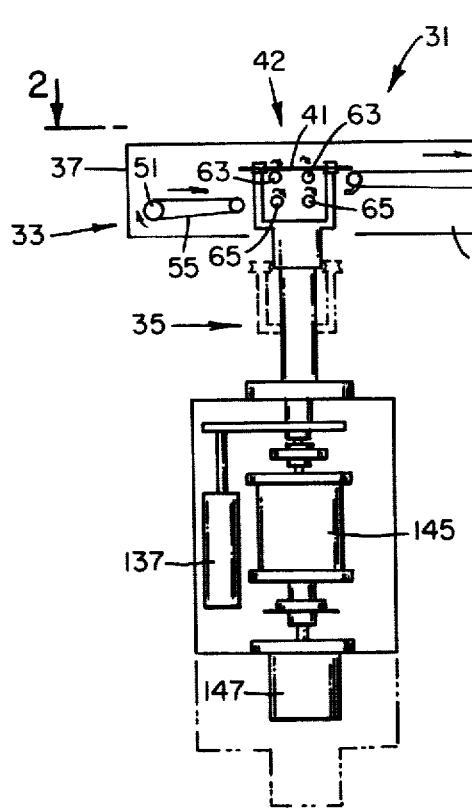
FIG_1
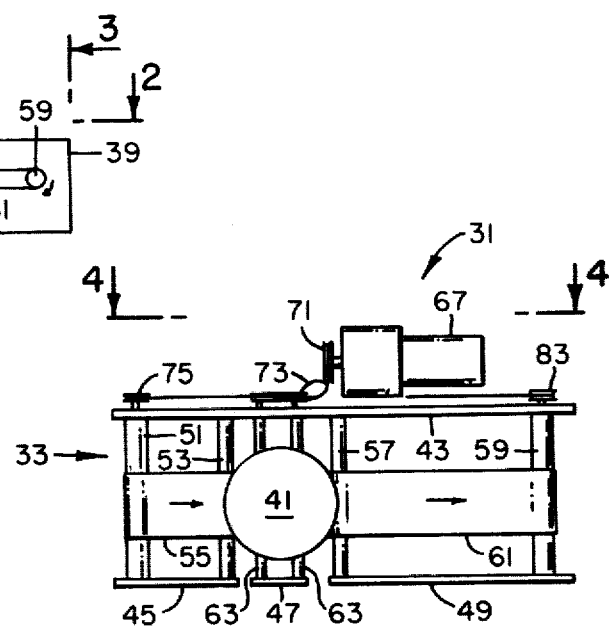
FIG_2
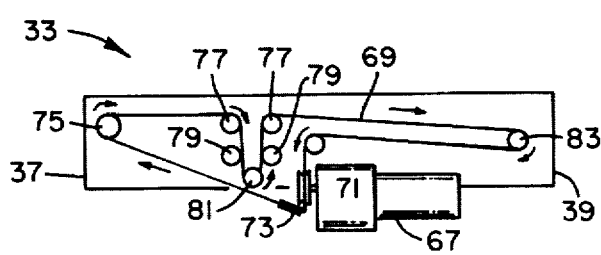
FIG_4
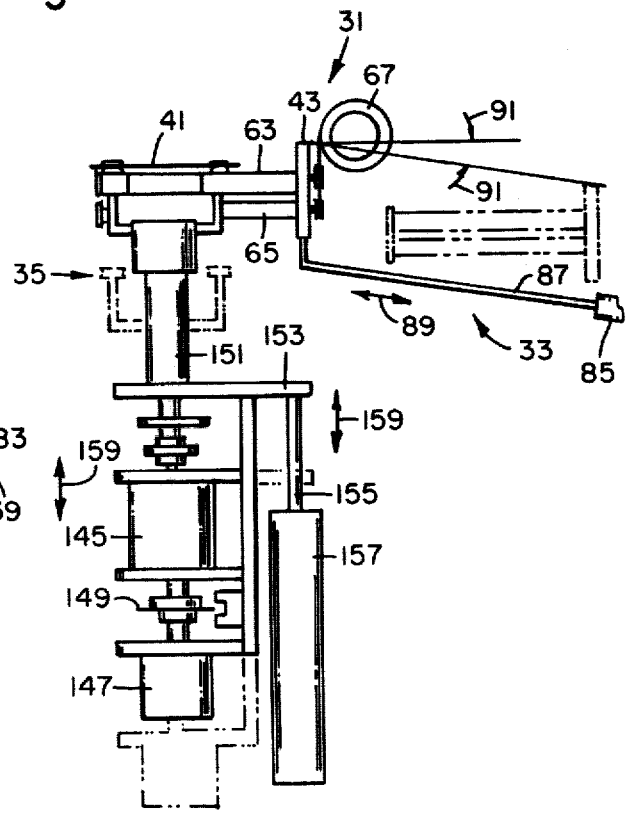
FIG_3

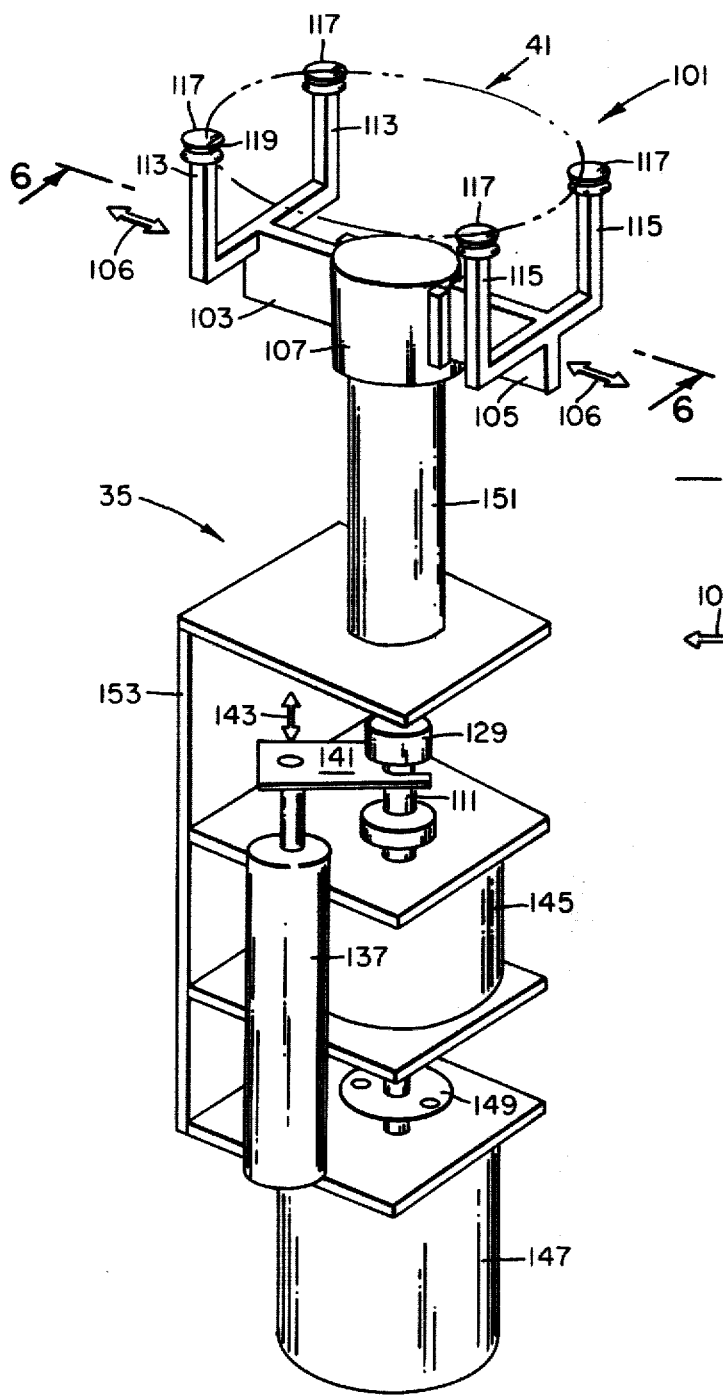
FIG_5  FIG_6

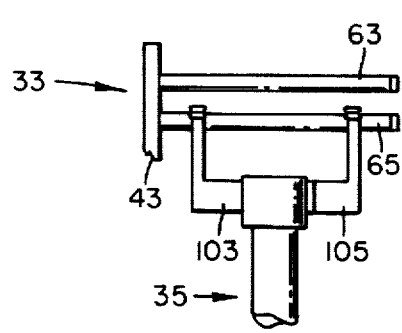
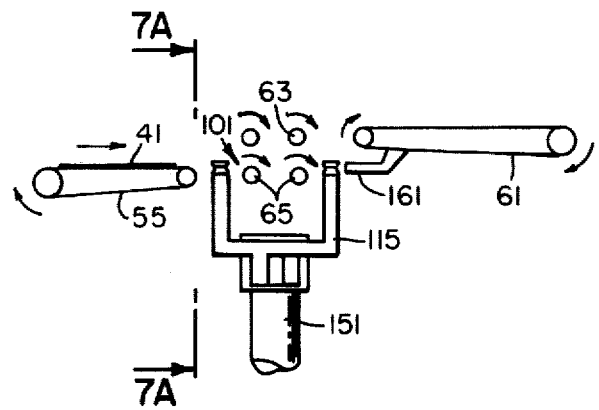
FIG_7A  FIG_7
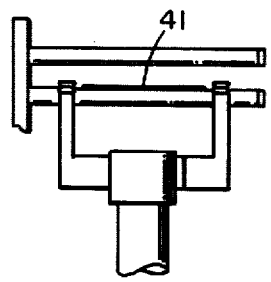
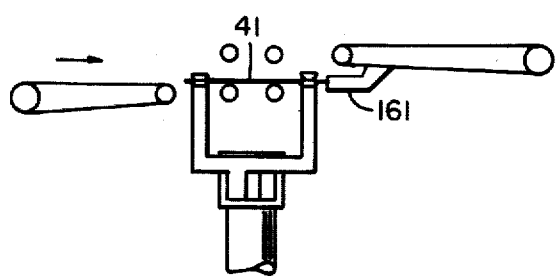
FIG_8A  FIG_8
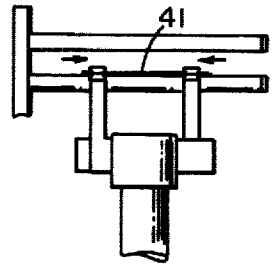
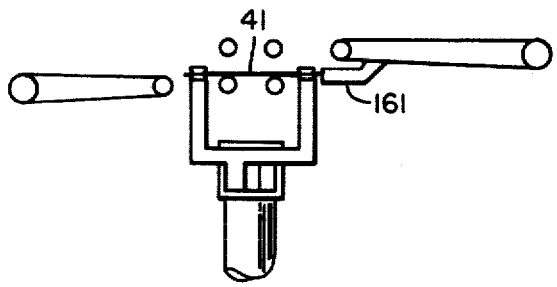
FIG_9A  FIG_9
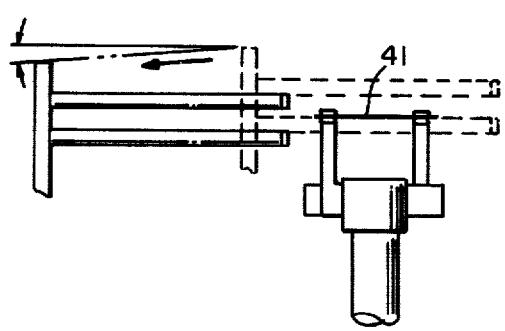
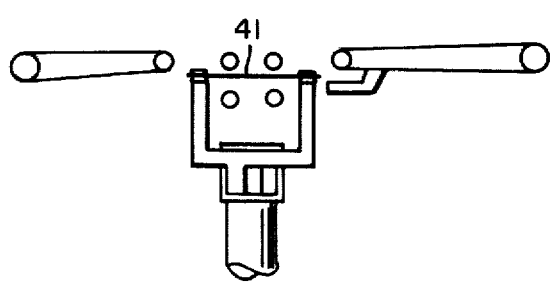
FIG_10A  FIG_10

FIG_11A
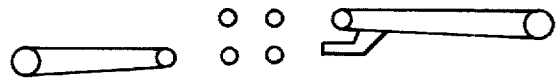
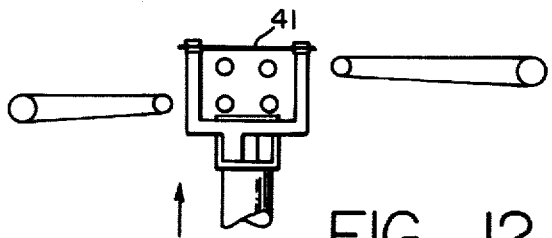
FIG_11
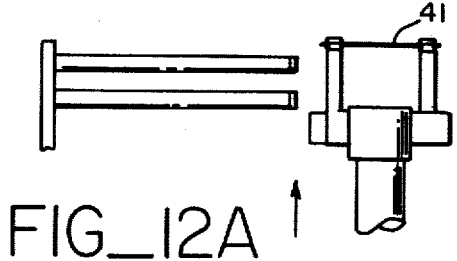
FIG_12A
FIG_12
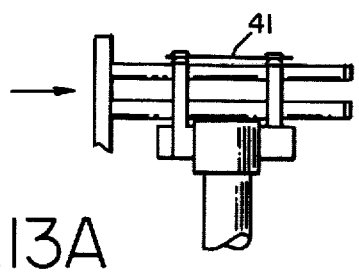
FIG_13A
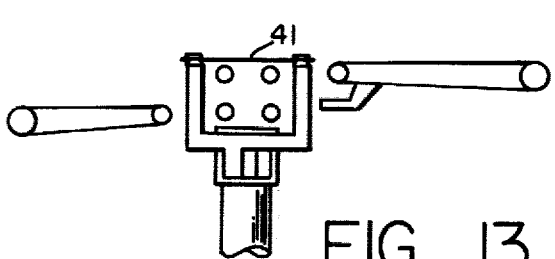
FIG_13
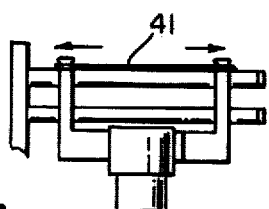
FIG_14A
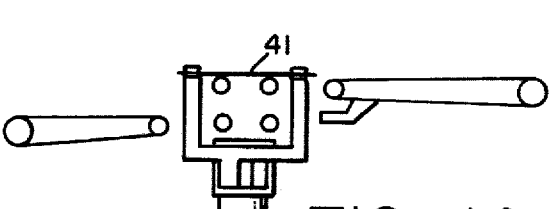
FIG_14
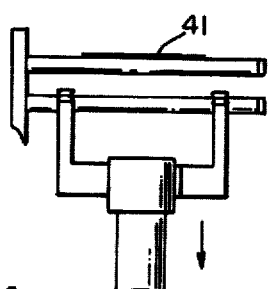
FIG_15A
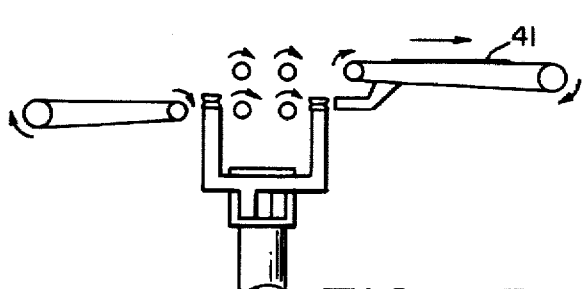
FIG_15

METHOD AND APPARATUS FOR DRYING WAFERS

CROSS REFERENCES TO RELATED APPLICATIONS

U.S. patent application Ser. No. 942,608 filed Sept. 15, 1978 now U.S. Pat. No. 4,217,977, by Johann Tam and entitled "Conveyor System" (and assigned to the same assignee as the assignee of the present application) discloses a conveyor system having a vertically movable spindle assembly for lifting wafers up and off of a conveyor and then lowering the wafer below the conveyor for a spin-dry operation.

BACKGROUND OF THE INVENTION

This invention relates to method and apparatus for drying wafers.

It has particular application to methods and apparatus which spin dry a wafer by gripping the wafer on its edge to eliminate contact with the face of a wafer and possible stains which can result from such face contact.

The present invention also has specific application to a carriage mechanism which brings a wet wafer into the drying station at one level and which takes the dry wafer out of the drying station at a different level to prevent any contact between the dry wafer and residual moisture at the incoming level.

Wafers that are used for the manufacture of integrated circuits must be thoroughly cleaned in order to reduce defects in the finished integrated circuits. Because the circuits themselves are very small, any foreign material, such as dirt, water stains, etc., can cause an unacceptably high rejection rate in the final product.

The wafers must therefore be cleaned on both sides, and this presents a problem of how to dry a wafer in a way to maintain cleanliness while eliminating possible stains.

It is generally considered that centrifugal drying is better than blow drying of a wet wafer. Centrifugal drying helps to overcome the surface tension and resultant clinging of moisture around the edge of a wafer that can result from blow drying.

Spin drying has been accomplished in the prior art by a vacuum chuck which gripped the wafer on the lower face of the wafer. This type of chuck mechanism has presented the problem of stains resulting from the contact between the chuck and the bottom face of the wafer.

One of the primary objects of the present invention is to spin dry a wafer using a wafer holder which grips the wafer on the edge of the wafer, rather than on a face, to eliminate contact and resultant stains on the wafer face.

Getting the wafer dry is one problem; keeping the wafer dry is another problem.

The wet wafer must be brought into a drying station, dried and then removed from the drying station. There can be a problem in keeping the wafer dry as it is handled at the drying station after the spin drying operation if there is residual moisture at the drying station resulting from the conveyor mechanism that brought the wet wafer into the drying station.

It is another primary object of the present invention to handle the wafer in a way so that the dry wafer conveyor mechanism is isolated from the wet conveyor mechanism to prevent any contact between the dry wafer and residual moisture on the wet wafer conveyor mechanism.

SUMMARY OF THE INVENTION

The method and apparatus of the present invention include a wafer holder which grips the wafer on its edge. The wafer holder comprises a nest which opens and closes.

In a specific embodiment the nest has two slide members which are mounted in a spindle head, and each slide member has a pair of spaced apart uprights at the outer end of the slide member. A wafer gripping bumper is mounted at the top of each upright, and each bumper has a groove which is shaped to receive the edge of the wafer in the groove.

Each of the slide members has a cam slot which engages a cam roller, and the cam slots are crossed at an angle so that movement of the cam roller vertically upwardly and downwardly expands and contracts the nest. An actuator rod is connected to the cam roller and is movable within the spindle to produce the opening and closing of the nest.

The wafer drying apparatus and method of the present invention also includes a carriage for handling the wafer at the drying station.

The carriage includes a wet conveyor for conveying a wet wafer into the drying station and a dry conveyor for conveying a dried wafer away from the drying station.

The carriage also includes support rollers disposed between the wet conveyor and the dry conveyor.

The dry conveyor is located at a different level than the wet conveyor to prevent any contact of the dry wafer with residual moisture at the wet conveyor.

The support rollers include an upper pair of support rollers located at the same level as the dry conveyor and a lower pair of support rollers located at the same level as the wet conveyor.

The carriage is retractable to permit the wafer holder to be lowered below the carriage for the spin drying operation, and the carriage moves downward at a slight angle as it is retracted to avoid any rubbing of the support rollers on the wafer during the shifting movement of the carriage.

Wafer drying apparatus and methods which embody the structural features described above and which are effective to function as described above comprise further, specific objects of this invention.

Other and further objects of the present invention will be apparent from the following description and claims and are illustrated in accompanying drawings which, by way of illustration, show preferred embodiments of the present invention and the principles thereof and what are now considered to be the best modes contemplated for applying these principles. Other embodiments of the invention embodying the same or equivalent principles may be used, and structural changes may be made as desired by those skilled in the art without departing from the present invention and the purview of the appended claims.

BRIEF DESCRIPTION OF THE DRAWINGS

FIG. 1 is a side elevation view of a wafer drying apparatus constructed in accordance with one embodiment of the present invention.

FIG. 2 is a top plan view taken along the line and in the direction indicated by the arrows 2—2 in FIG. 1.

FIG. 3 is an end elevation view taken along the line and in the direction indicated by the arrows 3—3 in FIG. 1.

FIG. 4 is a rear side elevation view of the drive for the carriage shown in FIG. 2.

FIG. 5 is an enlarged isometric view showing details of a wafer holder and related mechanism used in the apparatus shown in FIG. 1.

FIG. 6 is an enlarged, fragmentary view, partly in cross-section to show details of construction, and is taken along the line and in the direction indicated by the arrows 6—6 in FIG. 5.

FIGS. 7 through 15 are sequence views showing the relative positions of the carriage components and the wafer holder at different points in the cycle of operation of the apparatus shown in FIG. 1, and FIGS. 7A through 15A are end elevation views with each A view taken generally along the line and in the direction indicated by the arrows 7A—7A in FIG. 7.

FIGS. 7 and 7A show the positions of the components at the start of a cycle when a wet wafer is being conveyed into the drying station. In this position the nest (formed by sliding members of the wafer holder) is out (to let the wafer into the wafer holder), the spindle which rotates the wafer holder is in mid-position, and the carriage for conveying the wafer is moved in at the drying station.

FIGS. 8 and 8A show the wafer position bumper stopping the wafer in the nest.

FIGS. 9 and 9A show the nest closed on the wafer.

FIGS. 10 and 10A show the carriage retracted laterally away from the drying station and FIG. 10A shows the carriage moving downward at a slight angle with respect to the horizontal as it retracts.

FIGS. 11 and 11A show the spindle and wafer holder lowered to the bottom position for rotation to spin-dry the wafer.

FIGS. 12 and 12A show the spindle raised back to the top position after the wafer has been spin-dried.

FIGS. 13 and 13A show the carriage extended back in and under the wafer.

FIGS. 14 and 14A show the nest opened to release the wafer onto the carriage support rollers.

FIGS. 15 and 15A show the spindle returned to the mid position to await the next wafer for the start of a new cycle of operation.

DESCRIPTION OF THE PREFERRED EMBODIMENTS

A wafer drying apparatus constructed in accordance with one embodiment of the present invention is indicated generally by the reference numeral 31 in FIGS. 1, 2 and 3.

The wafer drying apparatus 31 shown in the drawings is a part of a wafer cleaner system which includes a number of components not shown in the drawings. The wafer cleaner system scrubs, rinses and dries wafers, such as silicon, GGG and sapphire wafers, which are subsequently used in the manufacture of integrated circuits.

In one particular embodiment of a wafer cleaner system which incorporates the wafer drying apparatus 31 of the present invention, O rings move wafers to and from standard H-type cassettes. The wafers are transferred from a wet index station through one or more brush stations and to the wafer drying apparatus 31 for a spin rinse and spin dry operation. The dry wafers are then transferred to a dry index station.

Since the present invention is concerned only with the handling of the wafers in the wafer drying apparatus 31, the other parts of the wafer cleaner system are not illustrated in the drawings.

The apparatus 31 includes two basic components, a carriage 33 and a wafer holder and rotator mechanism 35.

The carriage 33 has an inlet end 37 and an outlet end 39.

A wafer 41 is transported from the inlet end 37 to a drying station 42 and then to the outlet end 39.

As best illustrated in FIGS. 2 and 4, the carriage 33 comprises frame members 43, 45, 47 and 49.

Two rollers 51 and 53 are mounted for rotation between the frame members 43 and 45.

A conveyor 55 is looped over the rollers 51 and 53 to form a wet wafer conveyor for conveying a wet wafer to the drying station 42.

Two rollers 57 and 59 are mounted for rotation between the frame members 43 and 49, and a conveyor 61 is looped over these two rollers to provide a dry wafer conveyor for conveying a dry wafer from the drying station 42.

As illustrated in FIG. 1, the dry conveyor 61 is located at a level which is higher than the level of the wet conveyor 55. This prevents any contact of the dry wafer (after it has been dried as described in detail below) with residual moisture at the wet wafer conveyor 55.

The carriage 33 also includes wafer support rollers located between the wet conveyor 55 and the dry conveyor 61. There are four such wafer support rollers—an upper pair of support rollers 63 and a lower pair of support rollers 65. The upper support rollers 63 are level with the top surface of the dry conveyor belt 61, and the lower support rollers 65 are level with the top surface of the wet conveyor belt 55.

All four support rollers are mounted for rotation between the side frame members 43 and 47 of the carriage 33.

As best illustrated in FIG. 4, a single motor 67 and a single O ring drive belt 69 are used to drive all of the support rollers and both conveyors 55 and 61. As illustrated in FIG. 4, the motor 67 rotates a drive pulley 71 which drives the O ring drive belt 69. An idler pulley 73 is used to direct the drive belt to a pulley 75 connected to the roller 51. Pulleys 77 and 79 are connected to the support rollers 63 and 65. The pulley 81 is an idler pulley. And the pulley 83 is connected to the roller 59.

As best illustrated in FIG. 3, the carriage 33 is laterally shiftable between the position at the drying station 42 (as shown in bold outline) and the retracted position behind the drying station (as shown in dashed outline). The mechanism for shifting the carriage between these positions includes a carriage cylinder 85 and a cylinder rod 87 which is connected to the side frame 43. The rod 87 is movable in the direction indicated by the arrows 89.

The mechanism for shifting the carriage 33 laterally is constructed to move the carriage 33 downwardly at a slight angle (as indicated by the arrows 91 in FIG. 3) as the carriage is retracted. This downward movement moves the wafer support rollers 65 downward from the underside of the wafer 41 as the carriage is retracted to avoid rubbing and possible scratching of the wafer as the carriage is moved laterally.

The wafer holder and rotator mechanism 35 is shown in FIGS. 1 and 3 and in the enlarged views of FIGS. 5 and 6.

As best shown in FIG. 5, the mechanism 35 comprises a nest 101 which includes two slide members 103 and 105. The slide members 103 and 105 are movable within a slot 107 formed in a head 109 at the top of a rotatable spindle shaft 111.

The slide member 103 has a generally U shaped member at the outer end which includes a pair of uprights 113, and the slide member 105 has a pair of uprights 115. Each of the uprights 113 and 115 has a wafer holder bumper 117 at its upper end, and movement of the slide members 103 and 105 outward opens the nest 101 while retraction of the slide members 103 and 105 inward closes the nest 101.

Each of the wafer holder bumpers 117 has a circumferentially extending groove 119 which enables the bumpers to grip the wafer 41 securely on its edge. The wafer holder mechanism therefore does not contact the top or the bottom face of the wafer so that when the wafer is centrifugally dried (as will be described in detail below), the wafer has no stains because there is no chuck mechanism which contacts the face of the wafer.

The slide members 103 and 105 enable the nest 101 to be opened and closed, in the direction indicated by the arrows 106 in FIG. 5 and in FIG. 6, to release and to grip a wafer. This sliding movement of the members 103 and 105 also accommodates wafers of different diameters.

The sliding movement of the members 103 and 105 is produced by a cam roller 121 (see FIG. 6) which engages a cam slot 123 in the slide member 103 and a cam slot 125 in the slide member 105. The slots 123 and 125 are disposed at an angle with respect to each other as illustrated, and the cam roller 121 is connected to a shifter rod 127 so that vertical movement of the sifter rod 127 in an upward direction causes the nest 101 to expand outward while vertical movement of the shifter rod 127 downwardly causes the nest 101 to contract inwardly.

Vertical movement of the shifter rod 127 is produced by a shifter collar 129 having a connect pin 131.

A preload spring 133 is compressed between a spring retainer 135 and the upper end of the shifter collar 129 to provide a biasing force on the shifter collar 129, and a shifter cylinder has a rod 139 and connector bar 141 which is vertically movable to produce the movement of the shifter rod 127 in the vertical direction indicated by the arrows 143.

The rotary drive for the spindle shaft 111 is provided by a drive motor 145.

A stepper motor 147 is also connected to the spindle shaft 111, and an optical encoder wheel is also mounted on the shaft 111.

The drive motor 145 is energized to rotate the nest 101 for rinsing and for spin drying of the wafer 41; and when the motor 145 is de-energized, the nest 101 slows to a stop at a random angular position.

The optical encoder wheel 149 is used as a detector to detect the orientation of the nest 101 when the spin drying rotation has stopped, and the stepper motor 149 (which is connected mechanically in series with the drive motor 145) is then energized in response to the detector 149 to return the nest 145 to the proper angular orientation of the nest with respect to the carriage 33.

As illustrated in FIG. 6, the shaft 111 is mounted for rotation within a tubular spindle housing 151 by bearings 152.

As best shown in FIG. 3, the tubular housing 151 is mounted on a frame 153 which also mounts the drive motor 145, the stepper motor 147 and the shifter cylinder 137. The frame 153 is connected to a cylinder rod 155 of a cylinder 157, and the cylinder 157 is connected to a fixed support which is not illustrated in the drawings. Extension and retraction of the cylinder rod 155 thus moves the entire wafer holder and rotator mechanism 35 upward and downward between the uppermost position (illustrated in bold outline in FIG. 3) and the lowermost position (illustrated in phantom outline in FIG. 3) in the direction indicated by the arrows 159.

The vertical positioning mechanism provided by the cylinder 157, the cylinder rod 155 and the frame 153 is also effective to position the wafer holder and rotator mechanism at a third position (illustrated in FIGS. 8 and 8A) intermediate the uppermost and lowermost positions illustrated in FIGS. 1 and 3. This will be described in more detail below.

As illustrated in FIGS. 1 and 8, a wafer position bumper 161 is mounted in the carriage 33 so that an incoming wafer engages the bumper 161. A photosensor (not illustrated) then senses the presence of the wafer and causes the nest 101 to contract, stops the drive of the motor 67, and causes the retraction of the carriage 33 to begin.

A cycle of operation of the wafer drying apparatus 31 will now be described with specific reference to the sequence views shown in FIGS. 7 through 15 and related FIGS. 7A through 15A.

At the start of a cycle as shown in FIGS. 7 and 7A the nest 101 is extended out, the spindle housing 151 is in the mid position vertically and the carriage 33 is shifted inward over the drying station 42.

As an incoming wet wafer 41 moves over the lower pair of support rollers 65 from the incoming wet conveyor 55, the edge of the wafer 41 engages the wafer position bumper 161 as illustrated in FIG. 8. As described above, this causes the nest 101 to contract to grip the wafer 41 on its edge.

This also causes the carriage 33 to shift out and down as viewed in FIG. 10A.

The cylinder 157 then lowers the wafer holder and rotator mechanism 35 to the lower position as illustrated in FIGS. 11 and 11A. The drive motor 145 is then energized to rotate the wafer holder and wafer 41 for rinsing and centrifugal spin drying operations.

At the end of the spin drying operation, the optical encoder wheel 149 and stepper motor 147 step the shaft 111 around to provide the correct orientation of the nest 110 with respect to the rollers of the carriage 33, and the vertical positioning cylinder 157 and cylinder rod 155 then lift the mechanism 35 to the top position illustrated in FIGS. 12 and 12A.

The carriage 33 is then shifted inwardly to position the upper support rollers 63 under the dry wafer as illustrated in FIGS. 13 and 13A.

The nest 101 is then opened to release the wafer 41 onto the upper set of support rollers 63 as illustrated in FIGS. 14 and 14A.

The roller drive provided by the motor 67 and belt 69 then transports the dry wafer 41 onto the dry wafer conveyor 61 and out the outlet end 39 of the apparatus 31 illustrated in FIGS. 15 and 15A.

The mechanism 35 is returned to the mid position as illustrated in FIGS. 15 and 15A to await the next wafer for the start of another cycle of operation.

While I have illustrated and described the preferred embodiments of my invention, it is to be understood that these are capable of variation and modification and I therefore do not wish to be limited to the precise details set forth, but desire to avail myself of such changes and alterations as fall within the purview of the following claims.

I claim:

1. Apparatus for drying moisture from a wafer in a way to prevent stains on the sides of the wafer after the wafer has been washed on both sides, said apparatus comprising, wet wafer conveying means for conveying a wet wafer to a drying station, dry wafer conveying means for conveying the dry wafer away from the drying station, wafer holder means for holding the wafer by gripping the wafer on the edges of the wafer at the drying station, said wafer holder means being rotatable during a spin-drying operation and effective to grip the wafer only on the edge of the wafer during the spin-drying operation, positioning means for lowering the wet wafer holder below the wet wafer conveying means and dry wafer conveying means, rotating means for rotating the wafer holder means and wafer to spin-dry the wafer while the wafer is below the wet wafer conveying means and dry wafer conveying means, and wherein said positioning means are effective to raise the dry wafer to the level of the dry wafer conveying means after the wafer has been spin dryed by the rotating means.

2. Apparatus for drying moisture from a wafer in a way to prevent stains on the sides of the wafer after the wafer has been washed on both sides, said apparatus comprising, wet wafer conveying means for conveying a wet wafer to a drying station, dry wafer conveying means for conveying the dry wafer away from the drying station, wafer holding means for holding the wafer by gripping the wafer on the edges of the wafer at the drying station, positioning means for lowering the wet wafer holder below the wet wafer conveying means and dry wafer conveying means, rotating means for rotating the holder and wafer to spin-dry the wafer while the wafer is below the wet wafer conveying means and dry wafer conveying means, and wherein said positioning means are effective to raise the dry wafer to the level of the dry wafer conveying means after the wafer has been spin-dryed by the rotating means and wherein the wet wafer conveying means and dry wafer conveying means are at different levels at the drying station to prevent any contact of the dry wafer with residual moisture at the wet wafer conveying means.

3. The invention defined in claim 2 including a carriage on which the wet wafer conveying means and the dry wafer conveying means are mounted and which also includes wafer support rollers located between the wet wafer conveying means and the dry wafer conveying means.

4. The invention defined in claim 3 wherein the wafer support rollers include a first set of support rollers located at the level of the wet wafer conveying means and a second set of support rollers located at the level of the dry wafer conveying means.

5. The invention defined in claim 4 including common drive means for driving all of the wet wafer conveying means, support rollers and dry wafer conveying means.

6. The invention defined in claim 5 including wafer position bumper means positioned to engage the edge of a wet wafer at the drying station after the wet wafer has been moved into the proper position by the wet wafer conveyor means and support rollers and sensor means effective to stop the drive of the wafer support rollers when the wafer engages the wafer position bumper means.

7. The invention defined in claim 5 including carriage shift means for shifting the carriage laterally to and away from the drying station in coordination with the vertical movement of the wafer holder means.

8. The invention defined in claim 7 wherein the carriage positioning means are constructed to retract the carriage away from the drying station at a slight downward angle with respect to the horizontal so that the wafer support rollers move downward from the underside of the wafer as the carriage is retracted to avoid rubbing the wafer as the carriage is moved laterally while the wafer is gripped by the wafer holder means.

9. The invention defined in claim 1 including detector means for detecting the orientation of the wafer holder means when the spin-drying rotation has stopped and including stepper motor means responsive to the detector means for returning the wafer holder means to the proper angular orientation with respect to the conveying means.

10. The invention defined in claim 1 wherein the rotating means include a rotatable spindle, the wafer holder means include first and second slider members, each slider member has two wafer holder bumpers for gripping the edge of the wafer and the slider members are slidably mounted in the spindle to provide a nest which opens and closes on a wafer.

11. Apparatus for drying moisture from a wafer in a way to prevent stains on the sides of the wafer after the wafer has been washed on both sides, said apparatus comprising, wet wafer conveying means for conveying a wet wafer to a drying station, dry wafer conveying means for conveying the dry wafer away from the drying station, wafer holder means for holding the wafer by gripping the wafer on the edges of the wafer at the drying station, positioning means for lowering the wet wafer holder below the wet wafer conveying means and dry wafer conveying means, rotating means for rotating the holder and wafer to spin-dry the wafer while the wafer is below the wet wafer conveying means and dry wafer conveying means, and wherein said positioning means are effective to raise the dry wafer to the level of the dry wafer conveying means after the wafer has been spin dryed by the rotating means, and wherein the rotating means include a rotatable spindle, the wafer holder means include first and second slider members, each slider member has two wafer holder bumpers for gripping the edge of the wafer and the slider members are slidably mounted in the spindle to provide a nest which opens and closes on a wafer and including a cam slot in each slider member and a single cam roller engagable with the cam slots to control the lateral positions of the slider members with respect to one another.

12. The invention defined in claim 11 including a shifter rod connected to the cam roller and longitudinally movable up and down within the spindle for adjusting the lateral positioning of the slider members.

13. A method for drying moisture from a wafer to prevent stains on the sides of the wafer after the wafer has been washed on both sides, said method comprising, conveying the wet wafer on a conveyor to a drying station, gripping the wafer on its edge by a wafer holder at the drying station, lowering the wet wafer and holder below the conveyor, rotating the holder and wafer to spin-dry the wafer while gripping the wafer only on the edge of the wafer, raising the dry wafer to the level of the conveyor, releasing the grip of the wafer holder on the edge of the wafer, and conveying the dry wafer on a conveyor away from the drying station.

14. A method of drying moisture from a wafer to prevent stains on the sides of the wafer after the wafer has been washed on both sides, said method comprising, conveying the wet wafer on a conveyor to a drying station, gripping the wafer on its edge by a wafer holder at the drying station, lowering the wet wafer and holder below the conveyor, rotating the holder and wafer to spin-dry the wafer, raising the dry wafer to the level of the conveyor, releasing the grip of the wafer holder on the edge of the wafer, conveying the dry wafer on a conveyor away from the drying station, and conveying the wet wafer into the drying station at one level and conveying the dry wafer away from the drying station at another level to prevent any contact between the dry wafer and residual moisture at the incoming level.

15. A wafer holder for gripping a wafer on its edge for centrifugal rinsing and spin drying of the wafer, said wafer holder comprising, a rotatable spindle having a spindle head and a slot extending transversely through the head, two slide members mounted for sliding movement in opposite directions in said slot, each of said slide members having a pair of laterally spaced apart uprights at the outer end of the slide member and a wafer gripping bumper on the upper end of each upright to form a nest which can be expanded and contracted by the opposite sliding movements of the two slide members, each slide member having a cam slot with the cam slots in the slide members crossed with respect to one another, a cam roller engaged with the cam slots, and an actuator rod disposed within the spindle and connected to the cam roller and movable longitudinally within the spindle to expand and to contract the nest formed by the wafer gripping bumpers.

* * * * *